United States Patent
Choi et al.

(10) Patent No.: US 9,190,427 B2
(45) Date of Patent: Nov. 17, 2015

(54) ARRAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Seungjin Choi, Beijing (CN); Heecheol Kim, Beijing (CN); Youngsuk Song, Beijing (CN); Seongyeol Yoo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/347,451

(22) PCT Filed: Dec. 2, 2013

(86) PCT No.: PCT/CN2013/088347
§ 371 (c)(1),
(2) Date: Mar. 26, 2014

(87) PCT Pub. No.: WO2014/190702
PCT Pub. Date: Dec. 4, 2014

(65) Prior Publication Data
US 2014/0353690 A1    Dec. 4, 2014

(30) Foreign Application Priority Data

May 30, 2013  (CN) .............................. 201310209814
Dec. 2, 2013   (of) .................. PCT/CN2013/088347

(51) Int. Cl.
*H01L 33/00*     (2010.01)
*H01L 27/12*     (2006.01)

(52) U.S. Cl.
CPC .......... *H01L 27/1259* (2013.01); *H01L 27/124* (2013.01)

(58) Field of Classification Search
None
See application file for complete search history.

(56) References Cited

U.S. PATENT DOCUMENTS 8,654,292 B2     2/2014  Kubota et al.
2009/0284707 A1  11/2009 Cho et al.
(Continued)

FOREIGN PATENT DOCUMENTS

CN    101625491 A    1/2010
CN    101900913 A    12/2010
(Continued)

OTHER PUBLICATIONS

Chinese Office Action of Chinese Application No. 201310209814.1, mailed Apr. 3, 2015 with English translation.
(Continued)

*Primary Examiner* — Yasser A Abdelaziez
(74) *Attorney, Agent, or Firm* — Collard & Roe, P.C.

(57) ABSTRACT

An array substrate, a manufacturing method thereof, and a display device are provided. The array substrate comprise a base substrate (11), a gate line, a data line, and a pixel region defined by intersection of the gate line and the data line, which are formed on the base substrate (11), wherein the pixel region comprises a thin film transistor, and the thin film transistor comprises a gate, a gate insulation layer, an active layer, a source and a drain, the pixel region further comprise: at least one groove (110), formed on a surface of the base substrate (11); a first electrode layer (12) comprising at least one first electrode bar (120), the first electrode bars (120) are disposed in the groove (110) and electrically connected with each other; and a second electrode layer (13) comprising at least one second electrode bar (130), wherein the second electrode bars (130) are disposed outside the groove (110) and electrically connected with each other. No overlapping between the common electrode and the pixel electrode can be achieved, so as to improve display quality of the display device.

20 Claims, 4 Drawing Sheets

(56) References Cited

U.S. PATENT DOCUMENTS

| | | |
|---|---|---|
| 2010/0007836 A1 | 1/2010 | Lee |
| 2011/0303917 A1* | 12/2011 | Lee et al. ............... 257/59 |
| 2014/0054703 A1 | 2/2014 | Feng et al. |

FOREIGN PATENT DOCUMENTS

| | | |
|---|---|---|
| CN | 101995707 A | 3/2011 |
| CN | 102830560 A | 12/2012 |
| CN | 103105970 A | 5/2013 |
| CN | 103293811 A | 9/2013 |
| CN | 103309095 A | 9/2013 |
| KR | 20040012200 A | 2/2004 |

OTHER PUBLICATIONS

Second Chinese Office Action of Chinese Application No. 201310209814.1 in Chinese with English translation, mailed Aug. 14, 2015.

* cited by examiner

ARRAY SUBSTRATE AND MANUFACTURING METHOD THEREOF, AND DISPLAY DEVICE

CROSS REFERENCE TO RELATED APPLICATIONS

This application is the National Stage of PCT/CN2013/088347 filed on Dec. 2, 2013, which claims priority under 35 U.S.C. §119 of Chinese Application No. 201310209814.1 filed on May 30, 2013, the disclosure of which is incorporated by reference. The international application under PCT article 21(2) was not published in English.

FIELD OF THE ART

Embodiments of the present invention relate to field of liquid crystal display, and in particular, to an array substrate and manufacturing method thereof, and a display device comprising the array substrate.

BACKGROUND

Common liquid crystal display devices in conventional technology are mainly divided into advanced-super dimensional switching (AD-SDS or ADS) type, in plane switch (IPS) type, and twisted nematic (TN) type. The ADS type display device is formed with both a parallel electric field produced at edges of pixel electrodes on the same plane and a vertical electric field produced between a pixel electrode layer and a common electrode layer, so that liquid crystal molecules at all orientations, which are located directly above the pixel electrodes and between the pixel electrodes in a liquid crystal cell, can be rotated and aligned.

In the existing ADS type display device, since the pixel electrode and the common electrode have a large overlapping area and a small interval, it causes a storage capacitance Cst to be very large, thus it will suffer many limitations when designing. Currently, in order to solve the problem that the storage capacitance Cst is too large, it generally adopts a manner of alternately arranging the pixel electrode and the common electrode. However, in general circumferences, since the pixel electrode and the common electrode are formed by using transparent electrode material, and the manner of alternately arranging has a very high requirement on the precision of exposing process, it inevitably will increase the difficulty and cost of device and process control.

SUMMARY

Embodiments of the present invention provide an array substrate and manufacturing method thereof and a display device, which may reduce manufacturing cost and difficulty of the manufacturing process.

An embodiment of the present invention provides an array substrate, comprising a base substrate, a gate line, a data line, and a pixel region defined by intersection of the gate line and the data line, which are formed on the base substrate, wherein the pixel region may comprise a thin film transistor, and the thin film transistor may comprise a gate, a gate insulation layer, an active layer, a source and a drain, and the pixel region may further comprise:

at least one groove formed on a surface of the base substrate;

a first electrode layer comprising at least one first electrode bar, wherein the at least one first electrode bar is disposed in the corresponding groove and electrically connected with each other; and a second electrode layer comprising at least one second electrode bar, wherein the second electrode bar is disposed outside the groove and electrically connected with each other.

Preferably, the grooves formed on the base substrate may be equispaced.

Preferably, a depth of the groove may be greater than a thickness of the first electrode layer.

Preferably, the first electrode bar may be disposed in each groove, and the second electrode bar may be disposed outside each groove.

Alternatively, the gate insulation layer may be disposed between the first electrode layer and the second electrode layer, and the first electrode layer may be connected with the drain by a via hole in the gate insulation layer.

Alternatively, the array substrate may further comprise a passivation layer, and the gate insulation layer is disposed under the first electrode layer, and the passivation layer may be disposed between the first electrode layer and the second electrode layer, and the first electrode layer may be directly connected with the drain.

Alternatively, the array substrate may further comprise a passivation layer, and the passivation layer may be disposed between the first electrode layer and the second electrode layer, and the second electrode layer may be connected with the drain by a via hole in the passivation layer.

Alternatively, the array substrate may further comprise a passivation layer, and the gate insulation layer may be disposed between the first electrode layer and the second electrode layer, and the passivation layer may be disposed above the second electrode layer, and the second electrode layer may be directly connected with the drain.

An embodiment of the present invention further provides a method of manufacturing an array substrate, wherein the array substrate comprises a base substrate, a gate line, a data line, and a thin film transistor formed on a non-display region of the base substrate, the thin film transistor comprises a gate, a gate insulation layer, an active layer, a source and a drain, and the method comprises:

forming at least one groove on a surface of a display region of the base substrate;

forming a first transparent conductive thin film on the base substrate, and coating a first photoresist on the base substrate formed with the first transparent conductive thin film;

performing ashing treatment on the first photoresist to form a first photoresist pattern, the first photoresist pattern only covers a bottom of the groove;

performing etching process, to remove a portion of the first transparent conductive thin film not covered by the first photoresist pattern;

performing lift-off process of photoresist to lift off the first photoresist pattern, so as to form a first electrode layer comprising at least one first electrode bar;

forming an insulation layer on the base substrate formed with the first electrode layer;

coating a second photoresist on the base substrate formed with the insulation layer, and performing ashing treatment on the second photoresist to form a second photoresist pattern, the second photoresist pattern only covers a bottom of a groove in the insulation layer; and forming a second transparent conductive thin film on the base substrate formed with the second photoresist pattern, and then removing the second photoresist pattern and a portion of the second transparent conductive thin film on the second photoresist pattern by a lift-off process of photoresist, so as to form a second electrode layer comprising at least one second electrode bar.

Alternatively, the insulation layer may be at least one of the gate insulation layer and the passivation layer.

Alternatively, the first electrode layer may be connected with the drain, or the second electrode layer may be connected with the drain.

Preferably, the grooves on the base substrate may be equispaced.

Preferably, a depth of the groove may be greater than a thickness of the first electrode layer.

An embodiment of the present invention further provides a display device, comprising the above array substrate.

The array substrate and manufacturing method thereof and a display device provided by the present invention achieve no overlapping between the common electrode and the pixel electrode by forming the base substrate of the array substrate to be a base substrate with grooves, and disposing the first electrode layer in the grooves and disposing the second electrode layer outside the grooves. However, the array substrate in conventional technology is generally as illustrated in FIG. 1, and the common electrode 1 and the pixel electrode 2 are alternately disposed, since the pixel electrode and the common electrode are formed by using transparent electrode material, it needs to precisely guarantee no overlapping between the two electrode layers by relatively complicated manufacturing process and relatively high manufacturing cost. Compared with conventional technology, the embodiments of the present invention make use of the grooves on the base substrate, and can precisely guarantee no overlapping between the two electrode layers and reduce manufacturing cost and difficulty of the manufacturing process.

DETAILED DESCRIPTION

The technical solutions in the embodiments of the present invention will be described clearly and completely below in connection with the figures in the embodiments of the present invention. Obviously, the described embodiments are only a portion of the embodiments of the present invention, not all the embodiments.

Figure 1:
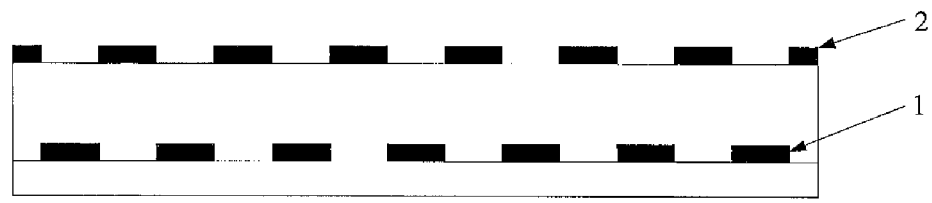
FIG. 1 is a schematic cross-section structural view of an array substrate in conventional technology.
Figure 2:
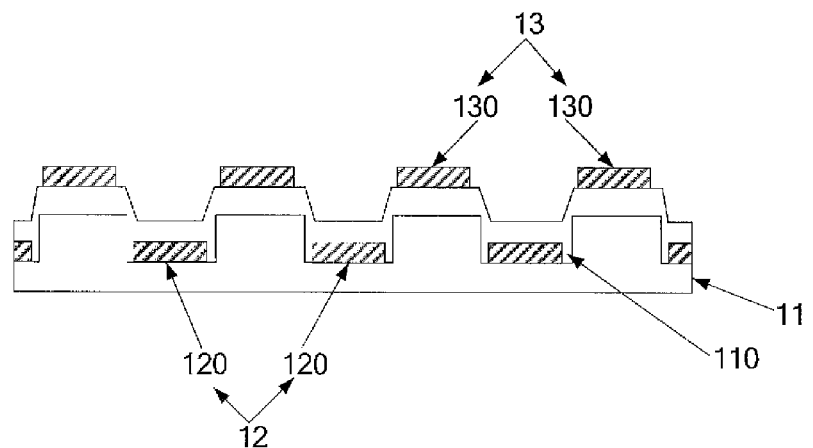
FIG. 2 is a schematic cross-section structural view of an array substrate provided by an embodiment of the present invention.
Figure 11:
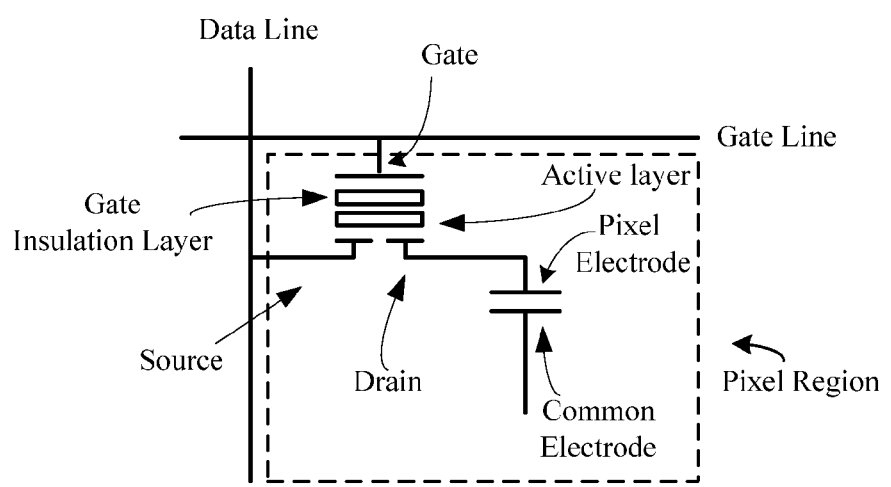
FIG. 11 is a schematic view of a pixel region defined by intersection of a gate line and a data line.

An embodiment of the present invention provides an array substrate, and the array substrate may comprise a base substrate 11, a gate line, a data line and a pixel region defined by intersection of the gate line and the data line, which are formed on the base substrate 11, as illustrated in FIG. 11. The pixel region as indicated by the dotted frame in FIG. 11 may comprise a thin film transistor, and the thin film transistor may comprise a gate, a gate insulation layer, an active layer, a source and a drain. As illustrated in FIG. 2, the pixel region may further comprise: at least one groove 110, formed on a surface of the base substrate 11; a first electrode layer 12, comprising at least one first electrode bar 120, wherein the at least one first electrode bar 120 is respectively disposed in the corresponding groove 110; and a second electrode layer 13, comprising at least one second electrode bar 130, wherein the second electrode bar 130 are disposed outside the groove. As illustrated in FIG. 2, "outside the groove" refers to top of a protrusion (relative to the groove) of the base substrate.

In the array substrate provided by the embodiment of the present invention, the base substrate of the array substrate having grooves thereon is formed, the first electrode layer is disposed in the grooves, and the second electrode layer is disposed outside the grooves. In this way, it may precisely guarantee no overlapping between the two electrode layers and reduce manufacturing cost and difficulty of the manufacturing process by using the groove on the base substrate.

Preferably, the grooves 110 formed on the base substrate may be equispaced.

Preferably, a depth of the groove 110 may be greater than a thickness of the first electrode layer.

Preferably, as illustrated in FIG. 2, the first electrode bar 120 may be disposed in each groove, and the second electrode bar 130 may be disposed outside each groove.

In the array substrate provided by the embodiment of the present invention, at least one of the gate insulation layer and the passivation layer may be disposed between the first electrode layer 12 and the second electrode layer 13.

In the array substrate provided by the embodiment of the present invention, one electrode layer of the first electrode layer and the second electrode layer is used as the pixel electrode to be connected with the drain, and the electrode layer connected with the drain may be the first electrode layer, and may also be the second electrode layer. It is to be noted here, no matter the first electrode layer or the second electrode layer, the electrode layer which is electrically connected to the common electrode line, will be used as the common electrode, and the electrode layer which is electrically connected with the drain of the thin film transistor will be used as the pixel electrode.

Alternatively, the first electrode layer may be connected with the drain of the thin film transistor, that is, the first electrode layer is pixel electrode, and the second electrode layer is common electrode, and there exist the following two cases at this time:

One case is: the first electrode layer is connected with the drain by a via hole in the gate insulation layer. In such case, the first electrode layer is first formed on the array substrate, and then the thin film transistor is formed on the array substrate, and then the passivation layer and the second electrode layer are formed. The gate insulation layer may be disposed between the first electrode layer and the second electrode layer. At this time, the gate insulation layer may be located above the first electrode layer, a via hole is formed in the gate insulation layer, and the via hole in the gate insulation layer is above the first electrode layer, and the drain may be connected with the first electrode layer by the via hole in the gate insulation layer.

The other case is: the first electrode layer is directly connected to the drain. Under such case, the thin film transistor is first formed on the array substrate, then the first electrode layer, the passivation layer and the second electrode layer are sequentially formed, and the passivation layer may be disposed between the first electrode layer and the second electrode layer. At this time, the first electrode layer is located above the gate insulation layer, and there is no layered structure between the first electrode layer and the drain, so the first electrode layer may be directly overlap jointed to the drain.

Alternatively, it is also possible that the second electrode layer is connected with the drain of the thin film transistor, that is, the second electrode layer is pixel electrode, and the first electrode layer is common electrode, and there are the following two cases at this time:

One case is: the second electrode layer may be connected with the drain by a via hole in the passivation layer. In such case, the passivation layer is first formed on the array substrate, and then the second electrode layer is formed, the second electrode layer is located above the passivation layer, the via hole in the passivation layer is located above the drain, and the second electrode layer may be connected with the drain by the via hole in the passivation layer.

The other case is: the second electrode layer may be directly connected to the drain. In such case, the first electrode layer is first formed on the array substrate and then the thin film transistor is formed, and then the second electrode layer and the passivation layer are sequentially formed, the second electrode layer is located under the passivation layer, there is no other layered structure between the second electrode layer and the drain, and the second electrode layer may be directly overlap jointed to the drain.

Figure 3:
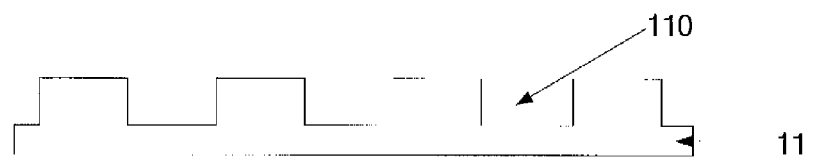
FIGS. 3-10 are schematic cross-section structural views of an array substrate during a method of manufacturing an array substrate provided by an embodiment of the present invention.

An embodiment of the present invention further provides a method of manufacturing an array substrate, and the array substrate may comprise a base substrate and a gate line, a data line and a thin film transistor formed on a non-display region of the base substrate, and the manufacturing method may comprise: a process of forming the gate line, the data line and the thin film transistor on the non-display region of the base substrate, wherein the process may be referred to the existing manufacturing process; and forming two electrode layers on a display region of the base substrate, wherein forming the two electrode layers may comprise the following steps in detail:

S1, as illustrated in FIG. 3, forming at least one groove 110 on a surface of the display region of the base substrate 11 by one patterning process. Preferably, the grooves 110 on the base substrate 11 may be equispaced.

Figure 4:
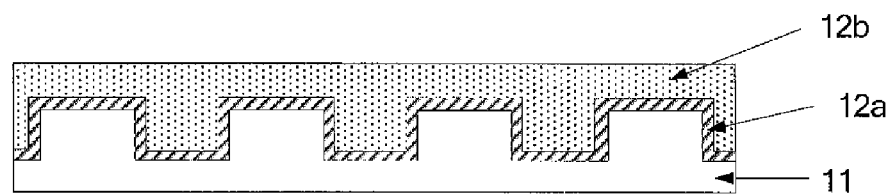

S2, as illustrated in FIG. 4, forming a first transparent conductive thin film 12a on the base substrate 11, and coating a first photoresist 12b on the substrate formed with the first transparent conductive thin film 12a.

Figure 5:
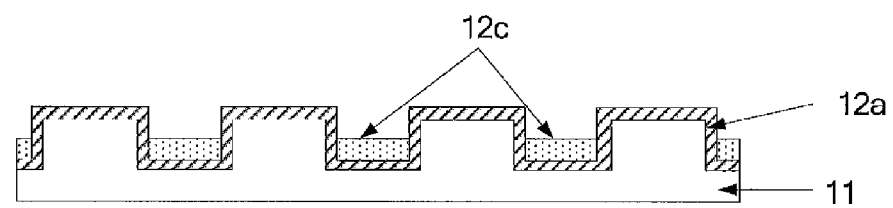

S3, as illustrated in FIG. 5, performing ashing treatment on the first photoresist 12b to form a first photoresist pattern 12c, the first photoresist pattern 12c only covers the bottom of the groove 110.

Figure 6:
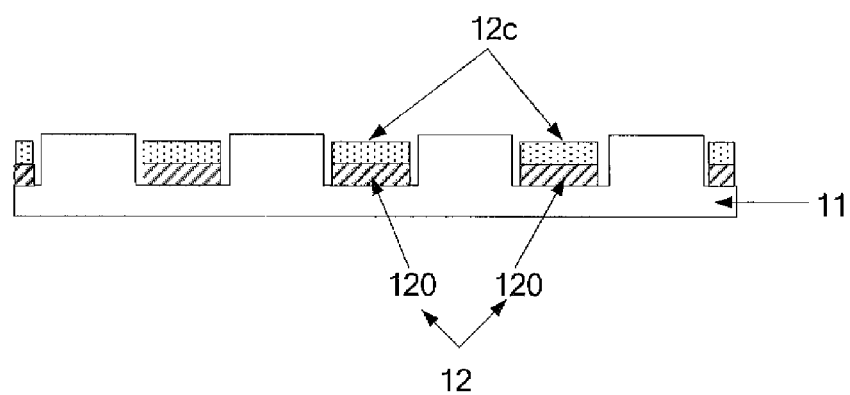

S4, performing etching process to remove a portion of the first transparent conductive thin film 12a not covered by the first photoresist pattern 12c. As illustrated in FIG. 6, a first electrode layer 12 comprising a plurality of first electrode bars 120 electrically connected with each other is formed in the groove 110 of the base substrate 11. Preferably, a depth of the groove 110 on the base substrate may be greater than a thickness of the first electrode layer 12.

Figure 7:
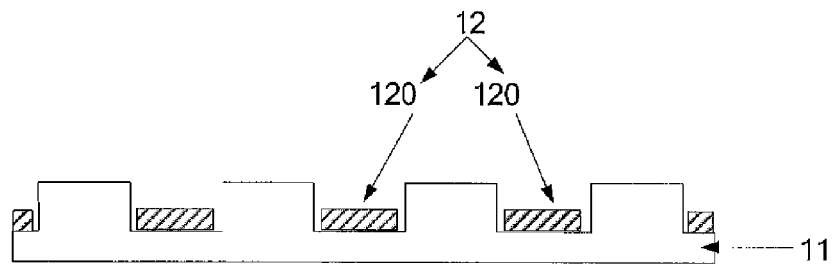

S5, performing lift-off process of photoresist to lift off the first photoresist pattern, to form the base substrate as illustrated in FIG. 7.

Figure 8:
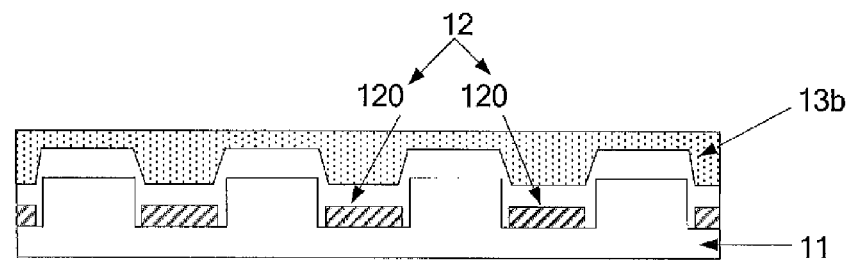

S6, forming an insulation layer on the base substrate formed with the first electrode layer, and then coating a second photoresist 13b on the base substrate formed with the insulation layer, to form the substrate as illustrated in FIG. 8. It is to be noted here that the insulation layer may be at least one of the gate insulation layer and the passivation layer. As illustrated in FIG. 8, since the base substrate has grooves, grooves corresponding to the grooves in the base substrate are formed in the insulation layer.

Figure 9:
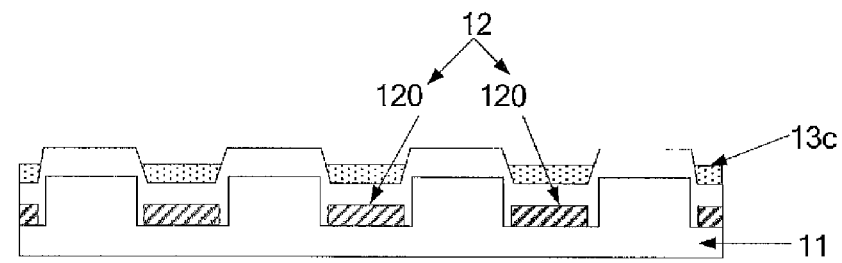

S7, performing ashing treatment on the second photoresist 13b to form a second photoresist pattern 13c as illustrated in FIG. 9, the second photoresist pattern 13c only covers a bottom of the groove in the insulation layer.

Figure 10:
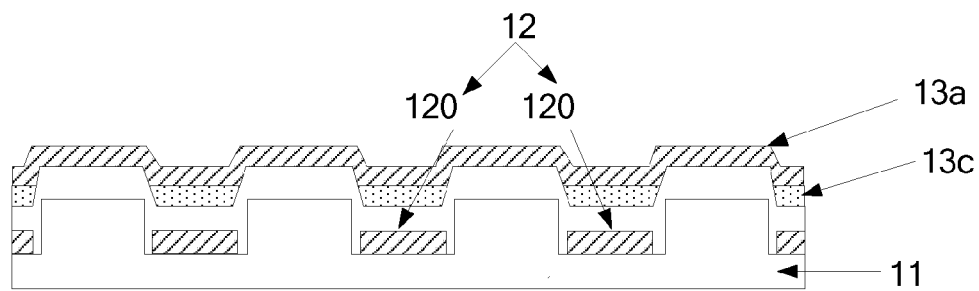

S8, as illustrated in FIG. 10, forming a second transparent conductive thin film 13a on the base substrate formed with the second photoresist pattern 13c.

S9, removing the second photoresist pattern 13c and a portion of the second transparent conductive thin film 13a on the second photoresist pattern 13c by a lift-off process of photoresist, so as to form a second electrode layer 13 comprising a plurality of second electrode bar 130 electrically connected with each other as illustrated in FIG. 2.

The formed first electrode layer may be connected with the drain of the thin film transistor, or the formed second electrode layer may be connected with the drain of the thin film transistor. It is to be noted here that, no matter the first electrode layer or the second electrode layer, the electrode layer, which is electrically connected to the common electrode line, will be used as the common electrode, and the electrode layer, which is electrically connected with the drain of the thin film transistor, will be used as the pixel electrode.

If the first electrode layer is directly connected to the drain, the manufacturing method may comprise: after the step S1, forming the thin film transistor on the non-display region of the base substrate with reference to the existing manufacturing process, wherein the thin film transistor comprises a gate, a gate insulation layer, an active layer, a source and a drain; then sequentially performing the steps S2-S5, to form the first electrode layer, wherein the first electrode layer may be directly formed on the drain; finally, first forming a passivation layer and then sequentially performing the steps S6-S9, to form the second electrode layer. At this time, the insulation layer may be the passivation layer.

If the first electrode layer is connected to the drain by the via hole in the gate insulation layer, the manufacturing method may comprise: first sequentially performing the steps S1-S5, to form the first electrode layer; then forming the thin film transistor on the non-display region of the base substrate with reference to the existing manufacturing process, the thin film transistor comprises a gate, a gate insulation layer, an active layer, a source and a drain, wherein when forming the gate insulation layer, a gate insulation layer comprising the via hole may be formed by patterning process, and the via hole in the gate insulation layer is formed above the first electrode layer, and the drain may be connected with the first electrode layer by the via hole in the gate insulation layer; finally, first forming the passivation layer and then performing the steps S6-S9 to form the second electrode layer, or first sequentially forming the steps S6-S9 to form the second electrode layer and then forming the passivation layer. At this time, the insulation layer may be the gate insulation layer, or the insulation layer may be the gate insulation layer and the passivation layer.

If the second electrode layer is directly connected to the drain, the manufacturing method may comprise: first sequentially performing the steps S1-S5, to form the first electrode layer, then forming the thin film transistor on the non-display region of the base substrate with reference to the existing manufacturing process, the thin film transistor comprises a gate, a gate insulation layer, an active layer, a source and a drain; and then performing the steps S6-S9 to form the second electrode layer, the second electrode layer may be directly formed on the drain; finally forming the passivation layer. At this time, the insulation layer may be the gate insulation layer.

If the second electrode layer is connected to the drain by the via hole in the passivation layer, the manufacturing method may comprise: first forming the first electrode layer and the thin film transistor on the base substrate, and then forming a passivation layer thin film on the base substrate, and forming the passivation layer comprising a via hole by patterning process, wherein the via hole in the passivation layer is formed above the drain; finally, sequentially forming the steps S6-S9, to form the second electrode layer, wherein the formed second electrode layer may be connected with the drain by the via hole in the passivation layer. At this time, the insulation layer may be the passivation layer, or the insulation layer may be the gate insulation layer and the passivation layer.

An embodiment of the present invention further provides a display device comprising the above array substrate, and the display device may be any product or component having displaying function, such as a liquid crystal display, a liquid crystal TV, a digital camera, a mobile phone, a tablet PC and so on.

It is to be noted here that, since the formation of the thin film transistor is a technology which is well known by those skilled in the art, the embodiments of the present invention do not give detailed description on how to form the thin film transistor. Those skilled in the art may understand that the top-gate type and bottom-gate type thin film transistors are both possible.

The forgoing are only detailed embodiments of the present invention, and the protection scope of the present invention is not limited thereto. To those skilled in the art, in the technical scope disclosed by the present invention, changes or replacements which can be easily conceivable should be included in the protection scope of the present invention. Thus, the protection scope of the present invention should be based on the protection scope of the claims.

What is claimed is:

1. An array substrate, comprising a base substrate, a gate line, a data line, and a pixel region defined by intersection of the gate line and the data line, which are formed on the base substrate, wherein the pixel region comprises a thin film transistor, and the thin film transistor comprises a gate, a gate insulation layer, an active layer, a source and a drain, wherein the pixel region further comprises:
    at least one groove, formed on a surface of the base substrate;
    a first electrode layer, comprising at least one first electrode bar, wherein the at least one first electrode bar is disposed in the corresponding groove and electrically connected with each other; and
    a second electrode layer, comprising at least one second electrode bar, wherein the second electrode bar is disposed outside the groove and electrically connected with each other.

2. The array substrate according to claim 1, wherein the grooves formed on the base substrate are equispaced.

3. The array substrate according to claim 1, wherein a depth of the groove is greater than a thickness of the first electrode layer.

4. The array substrate according to claim 1, wherein the first electrode bar is disposed in each groove and the second electrode bar is disposed outside each groove.

5. The array substrate according to claim 1, wherein the gate insulation layer is disposed between the first electrode layer and the second electrode layer; and
    the first electrode layer is connected with the drain by a via hole in the gate insulation layer.

6. The array substrate according to claim 1, wherein the array substrate further comprises a passivation layer, and the gate insulation layer is disposed under the first electrode layer, and the passivation layer is disposed between the first electrode layer and the second electrode layer; and
    the first electrode layer is directly connected with the drain.

7. The array substrate according to claim 1, wherein the array substrate further comprises a passivation layer, and the passivation layer is disposed between the first electrode layer and the second electrode layer; and
    the second electrode layer is connected with the drain by a via hole in the passivation layer.

8. The array substrate according to claim 1, wherein the array substrate further comprises a passivation layer, and the gate insulation layer is disposed between the first electrode layer and the second electrode layer, and the passivation layer is disposed above the second electrode layer; and
    the second electrode layer is directly connected with the drain.

9. A method of manufacturing an array substrate, wherein the array substrate comprises a base substrate, a gate line, a data line and a thin film transistor formed on a non-display region of the base substrate, wherein the thin film transistor comprises a gate, a gate insulation layer, an active layer, a source and a drain, and the method comprises:
    forming at least one groove on a surface of a display region of the base substrate;
    forming a first transparent conductive thin film on the base substrate, and coating a first photoresist on the base substrate formed with the first transparent conductive thin film;
    performing ashing treatment on the first photoresist to form a first photoresist pattern, the first photoresist pattern only covers a bottom of the groove;
    performing etching process to remove a portion of the first transparent conductive thin film not covered by the first photoresist pattern;
    performing lift-off process of photoresist to lift off the first photoresist pattern, so as to form a first electrode layer comprising at least one first electrode bar;
    forming an insulation layer on the base substrate formed with the first electrode layer;
    coating a second photoresist on the base substrate formed with the insulation layer, and performing ashing treatment on the second photoresist to form a second photoresist pattern, the second photoresist pattern only covers a bottom of a groove in the insulation layer; and
    forming a second transparent conductive thin film on the base substrate formed with the second photoresist pattern, and then removing the second photoresist pattern and a portion of the second transparent conductive thin film on the second photoresist pattern by a lift-off process of photoresist, so as to form a second electrode layer comprising at least one second electrode bar.

10. The method according to claim 9, wherein,
    the insulation layer comprises at least one of the gate insulation layer and the passivation layer;
    the first electrode layer is connected with the drain, or the second electrode layer is connected with the drain.

11. The method according to claim 9, wherein the grooves on the base substrate are equispaced.

12. The method according to claim 9, wherein a depth of the groove is greater than a thickness of the first electrode layer.

13. A display device, comprising the array substrate according to claim 1.

14. The array substrate according to claim 2, wherein the first electrode bar is disposed in each groove and the second electrode bar is disposed outside each groove.

15. The array substrate according to claim 3, wherein the first electrode bar is disposed in each groove and the second electrode bar is disposed outside each groove.

16. The array substrate according to claim 2, wherein the gate insulation layer is disposed between the first electrode layer and the second electrode layer; and the first electrode layer is connected with the drain by a via hole in the gate insulation layer.

17. The array substrate according to claim 3, wherein the gate insulation layer is disposed between the first electrode layer and the second electrode layer; and the first electrode layer is connected with the drain by a via hole in the gate insulation layer.

18. The array substrate according to claim 2, wherein the array substrate further comprises a passivation layer, and the gate insulation layer is disposed under the first electrode layer, and the passivation layer is disposed between the first electrode layer and the second electrode layer; and the first electrode layer is directly connected with the drain.

19. The array substrate according to claim 3, wherein the array substrate further comprises a passivation layer, and the gate insulation layer is disposed under the first electrode layer, and the passivation layer is disposed between the first electrode layer and the second electrode layer; and the first electrode layer is directly connected with the drain.

20. The array substrate according to claim 2, wherein the array substrate further comprises a passivation layer, and the passivation layer is disposed between the first electrode layer and the second electrode layer; and the second electrode layer is connected with the drain by a via hole in the passivation layer.

* * * * *